United States Patent
Amiel et al.

(12)

(10) Patent No.: US 7,333,847 B2
(45) Date of Patent: Feb. 19, 2008

(54) METHOD FOR EVALUATION OF TISSUE ADHESION LEVEL

(75) Inventors: David Amiel, San Diego, CA (US); Richard David Coutts, San Diego, CA (US); Robert M. Healey, San Diego, CA (US)

(73) Assignee: Seikagaku Kogyo Kabushiki Kaisha, Tokyo (JP)

( * ) Notice: Subject to any disclaimer, the term of this patent is extended or adjusted under 35 U.S.C. 154(b) by 649 days.

(21) Appl. No.: 10/793,942

(22) Filed: Mar. 8, 2004

(65) Prior Publication Data

US 2004/0236208 A1  Nov. 25, 2004

Related U.S. Application Data

(60) Provisional application No. 60/452,560, filed on Mar. 7, 2003.

(51) Int. Cl.
*A61B 5/05* (2006.01)
(52) U.S. Cl. ...................................... 600/410
(58) Field of Classification Search .................... None
See application file for complete search history.

(56) References Cited

U.S. PATENT DOCUMENTS 5,622,685 A * 4/1997 Sinn et al. .................. 424/1.65

OTHER PUBLICATIONS

Liu et al. A Collagen-Based Sealant to Prevent In Vivo Reformation of Epidural Scar Adhesions in an Adult Rat Laminestomy Model; Journal of Neurosurgery (Spine 1) vol. 97 (2002) pp. 69-74.*

* cited by examiner

*Primary Examiner*—Jon Weber
*Assistant Examiner*—Paul Martin
(74) *Attorney, Agent, or Firm*—Sughrue Mion, PLLC

(57) ABSTRACT

Provided are a method for evaluation of tissue adhesion level which comprises relating the detection result of gadolinium from MRI image, on which a cross-section of a "boundary surface between a first tissue and a second tissue" of an animal administered with gadolinium has been imaged, to the adhesion level between the first tissue and the second tissue; and a detecting agent of tissue adhesion level. The detecting method of the present invention and detecting agent of the present invention are markedly useful, because they make it possible to detect the adhesion level, which is otherwise difficult to detect from the outside of the body, conveniently, speedily and precisely.

5 Claims, 11 Drawing Sheets n = 10
SACRIFICE AT 4 WK

T1 FS Gad

T1

R6817 T1 FS Gad

GRADE 2
2.43mm

GRADE 1
1.31mm

GRADE 0
0.00mm

METHOD FOR EVALUATION OF TISSUE ADHESION LEVEL

This application claims benefit of Provisional Application No. 60/452,560 filed Mar. 7, 2003; the disclosure of which is incorporated herein by reference.

FIELD OF THE INVENTION

The present invention relates to an evaluation method of adhesion level in the tissue and a detecting agent of adhesion level.

BACKGROUND OF THE INVENTION

First, abbreviations employed herein will be described.
MRI: magnetic resonance image
L6: sixth vertebral arch Evaluation of tissue adhesion has a very important meaning for development of an adhesion preventive. There has existed no convenient method for evaluating the adhesion level and it was difficult to evaluate it precisely.

Laminectomy is an operation adapted to disk herniation or vertebral canal stricture and it happens to form adhesion between the dura covering the spinal cord and the peripheral tissue. This adhesion is causative of post-operative recurrent pain.

Although MRI can be employed for the evaluation of the vertebral body, it was considered difficult to directly evaluate the adhesion level.

An object of the present invention is therefore to provide a method for detecting tissue adhesion level precisely, conveniently, speedily and safely.

SUMMARY OF THE INVENTION

With a view toward overcoming the above-described problem, the present inventors have proceeded with an extensive investigation. As a result, it has been found that adhesion level (strength of adhesion and the like) can be detected precisely, conveniently, speedily and safely by using MRI and gadolinium as a contrast medium for MRI, leading to the completion of the present invention.

In one aspect of the present invention, there is thus provided a method for evaluation of tissue adhesion level, which comprises correlating the detection result of gadolinium from an MRI image, on which the cross-section of a "boundary surface between a first tissue and a second tissue" of an animal administered with gadolinium has been imaged, to adhesion level between the first tissue and the second tissue (which will hereinafter be called "detecting method of the present invention").

It is preferred that the "detection result of gadolinium" means the length of a site stained by gadolinium in the cross-section of the "boundary surface between a first tissue and a second tissue"; "adhesion level" means the strength of adhesion; the "strength of adhesion" means a force required for separating the first tissue from the second tissue; the "first tissue" is a vertebral body, while the "second tissue" is a spinal cord with dura; and this "adhesion" is adhesion occurring after laminectomy.

In another aspect of the present invention, there is also provided an agent for detecting tissue adhesion level, which comprises gadolinium, is administered to an animal requiring evaluation of adhesion level between a first tissue and a second tissue, and is used for evaluating tissue adhesion level by relating the detection result of gadolinium from an MRI image, on which the cross-section of a "boundary surface between a first tissue and a second tissue" of an animal administered with gadolinium has been imaged, to adhesion level between the first tissue and the second tissue (which will hereinafter be called "detecting agent of the present invention"). It is preferred that the "detection result of gadolinium" means the length of the site stained by gadolinium; "adhesion level" means the strength of adhesion; the "strength of adhesion" means a force required for separating the first tissue from the second tissue; the "first tissue" is a vertebral body, while the "second tissue" is a spinal cord with dura; and this "adhesion" is adhesion occurring after laminectomy.

DETAILED DESCRIPTION OF THE INVENTION

Figure 1:
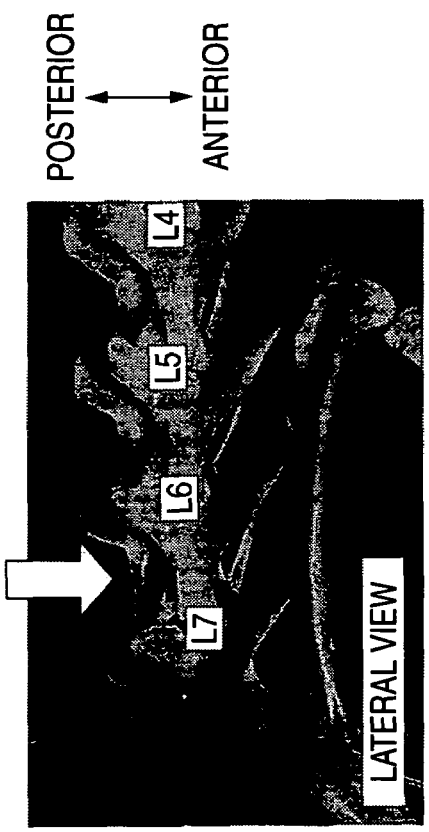
FIG. 1 illustrates a site of the sixth lumbar vertebra of a rabbit from which the vertebral arch has been excised.
Figure 1:
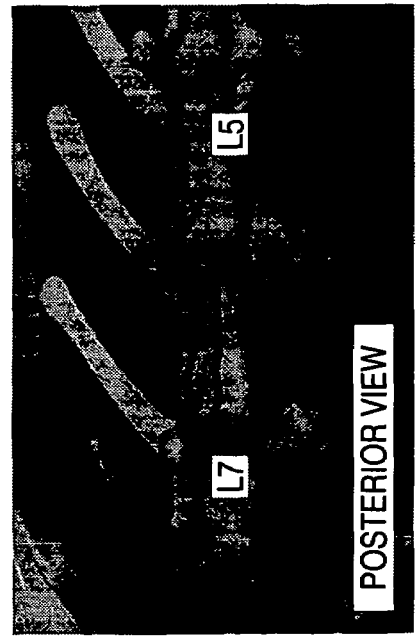
Figure 1:

The mode for carrying out the present invention will next be described.

<1> Detecting Method of the Present Invention

The detecting method of the present invention is a method for evaluating tissue adhesion level, which comprises relating the detection result of gadolinium from MRI image, on which the cross-section of a "boundary surface between a first tissue and a second tissue" of an animal administered with gadolinium has been imaged, to adhesion level between the first tissue and the second tissue.

The term "gadolinium" as used herein means not only gadolinium itself but also a gadolinium-containing compound. For example, gadodiamide hydrate, gadoteridol, meglumine gadoterate and meglumine gadopentetate to be used as a conventional contrast medium for MRI each contains gadolinium. Such a compound is also usable in the present invention.

Animals to be administered with gadolinium are those requiring evaluation of tissue adhesion level. Although no particular limitation is imposed on the kind of the animal, vertebrate animals, more preferably mammals, especially human beings are preferred.

Although there is no particular limitation imposed on the administration amount and administration route of gadolinium, the ordinarily employed administration amount and administration route of a contrast medium for MRI can be adopted. As a specific administration route, intravenous administration is preferred.

After administration of gadolinium, MRI is conducted to obtain an image on which the cross-section of a "boundary surface between a first tissue and a second tissue" has been imaged. MRI may be conducted in a conventional manner, but it is necessary to adjust the location of the cross-section of the first tissue and the second tissue for evaluating tissue adhesion within the MRI image. Described specifically, it is preferred to use, as an image plane, a plane vertical to the contact surface (adhesion surface) between the first tissue and second tissue. The image plane is however not exactly vertical to the contact surface (adhesion surface) between the first tissue and the second tissue. It is only necessary that the MRI image contain the cross-sections of the first tissue and the second tissue. On such an MRI image, signals derived from gadolinium are detected.

The signals derived from gadolinium are usually detected as a white portion on the MRI image. This portion is regarded as a detection result of gadolinium. This "detection result of gadolinium" may be expressed in numerical terms as an area of the white portion derived from gadolinium, or as strength of whiteness. When this white portion is detected as signals having a certain width, the detection result may be expressed in numerical terms as "length" of the white portion.

In the detecting method of the present invention, an MRI image on which the cross-section of a "boundary surface between a first tissue and a second tissue" has been imaged is used so that it is preferred to evaluate the length as a length of the site stained by gadolinium in the cross-section of a "boundary surface between a first tissue and a second tissue". Adhesion level can be detected by this method. This "adhesion level" is preferably the strength of adhesion, and this "strength of adhesion" is preferably a force necessary for separating the first tissue from the second tissue.

Although no particular limitation is imposed on the "first tissue" and the "second tissue" in the detecting method of the present invention, the "first tissue" is preferably a vertebral body and in this case, the "second tissue" is preferably a spinal cord with dura.

Although no particular limitation is imposed on the "adhesion" detected by the detecting method of the present invention insofar as it is tissue adhesion formed between bio tissues, adhesion occurring after laminectomy is preferred.

<2> Detecting Agent of the Present Invention

The detecting agent of the present invention is an agent for detecting tissue adhesion level, which comprises gadolinium, is administered to an animal requiring evaluation of adhesion level between a first tissue and a second tissue, and is used for evaluating tissue adhesion level by correlating the detection result of gadolinium from an MRI image, on which the cross-section of a "boundary surface between a first tissue and a second tissue" of an animal administered with gadolinium has been imaged, to adhesion level between the first tissue and the second tissue.

The terms "detection result of gadolinium", "adhesion level" and "strength of adhesion" are similar to those employed in "<1> detecting method of the present invention". In addition, the terms "first tissue", "second tissue" and "adhesion" are also similar to those employed in "<1> detecting method of the present invention".

Although no particular limitation is imposed on the form of the detecting agent of the present invention, it is preferred to adopt the similar form to that of ordinarily employed contrast media for MRI having gadolinium as an effective ingredient. The detection agent in the liquid form is preferred.

Although no particular limitation is imposed on the content of gadolinium in the detecting agent of the present invention, it is, for example, about 0.01 mmol/L to 1.0 mmol/L when the agent is in the liquid form.

The detecting agent of the present invention can be formulated in a known manner. Upon formulation, usable are the other pharmaceutically active components, and commonly used components for pharmaceuticals such as stabilizers, emulsifiers, osmotic pressure regulators, buffers, isotonizing agents, preservatives, soothing agents, colorants, elixirs, binders, lubricants, and disintegrants.

The animals to be administered with the detecting agent of the present invention, and administration amount and administration route of the detecting agent of the present invention are similar to those described above in the "<1> detecting method of the present invention".

The detecting agent of the present invention can be used in accordance with the above-described "<1> detecting method of the present invention".

The detection method of the present invention and detecting agent of the present invention are markedly useful, partly because they make it possible to detect the adhesion level, which is otherwise difficult to detect from the outside of the body, conveniently, speedily and precisely, and partly because they are usable not only clinically but also for the development of pharmaceuticals or evaluation of medical devices.

The present invention will hereinafter be described in further detail by Example. It should however be borne in mind that the present invention is not limited to or by it.

EXAMPLE 1

Material and Method

From NZW rabbits (n=10), the vertebral arch of the sixth lumbar vertebra was excised (L6 Laminectomy) (FIG. 1). On Week 4, gadolinium was administered, followed by MRI imaging.

Figure 2:
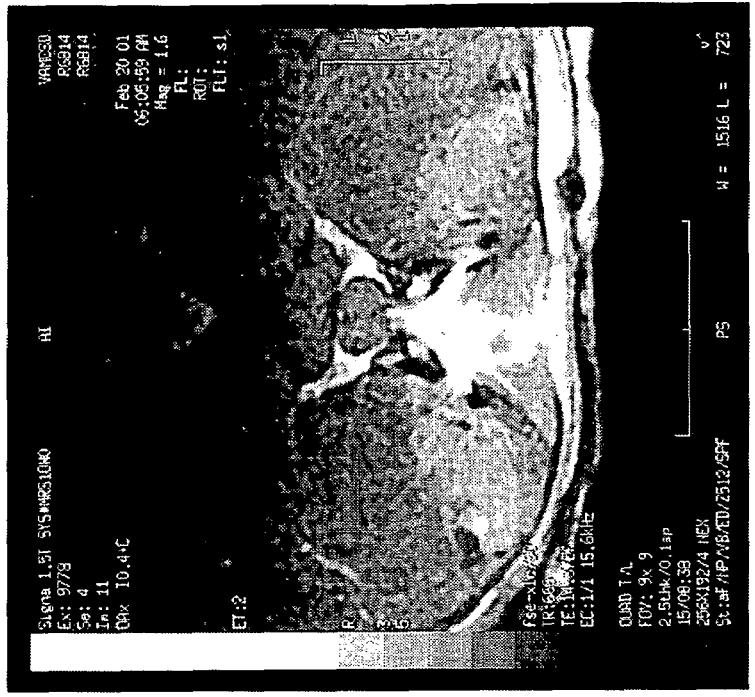
FIG. 2 illustrates one example of an MRI image.
Figure 2:

An example of the MRI image is shown in FIG. 2. An MRI image in the gadolinium free case is shown on the left side of FIG. 2, while an MRI image when gadolinium was administered is shown on the right side. As is apparent from the image (on the right side of FIG. 2) obtained by administering gadolinium to suppress signals derived from fat, the scar tissue (between the vertebral body and dura) is white highlighted.

Figure 3:
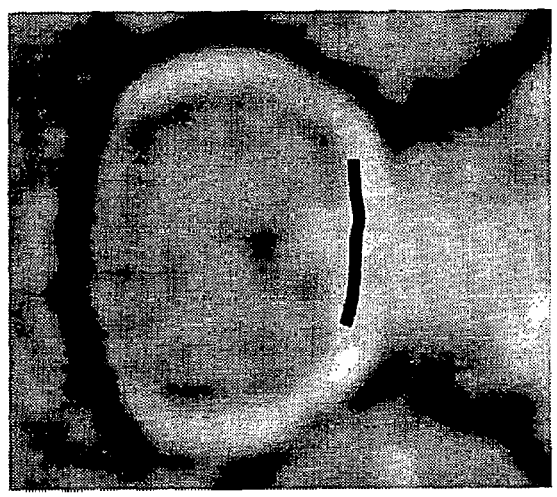
FIG. 3 is an enlarged cross-sectional view of MRI at the boundary surface between the vertebral body and dura.
Figure 3:
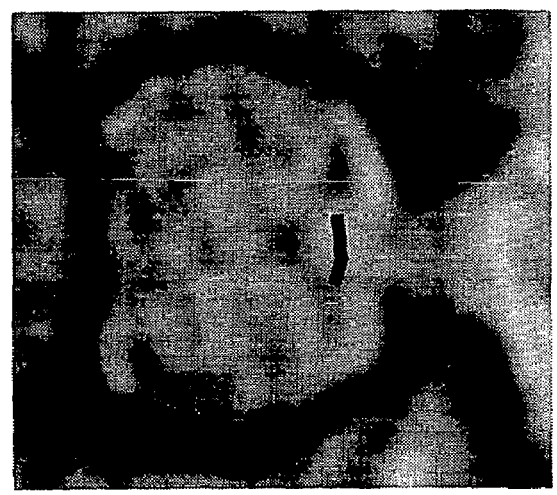
Figure 3:

FIG. 3 is an enlarged cross-sectional view of the boundary surface between the vertebral body and dura. The diagram on the left side of FIG. 3 is one example in which the length of a site stained by gadolinium in the cross-section of the boundary surface between the vertebral body and dura is regarded as "Grade 0". In this cross-section of the boundary surface between the vertebral body and dura, the length of the site stained by gadolinium is 0.00 mm.

In the central diagram of FIG. 3, shown is one example in which the length of a site stained by gadolinium, in the cross-section of the boundary surface between the vertebral body and dura is regarded as "Grade 1". In this cross-section of the boundary surface between the vertebral body and dura, the length of the site stained by gadolinium is 1.31 mm.

In the diagram on the right side of FIG. 3, shown is one example in which the length of the site stained by gadolinium in the cross-section of the boundary surface between the vertebral body and dura is regarded as "Grade 2". In this cross-sectional view of the boundary surface between the vertebral body and dura, the length of the site stained by gadolinium is 2.43 mm.

Figure 4:
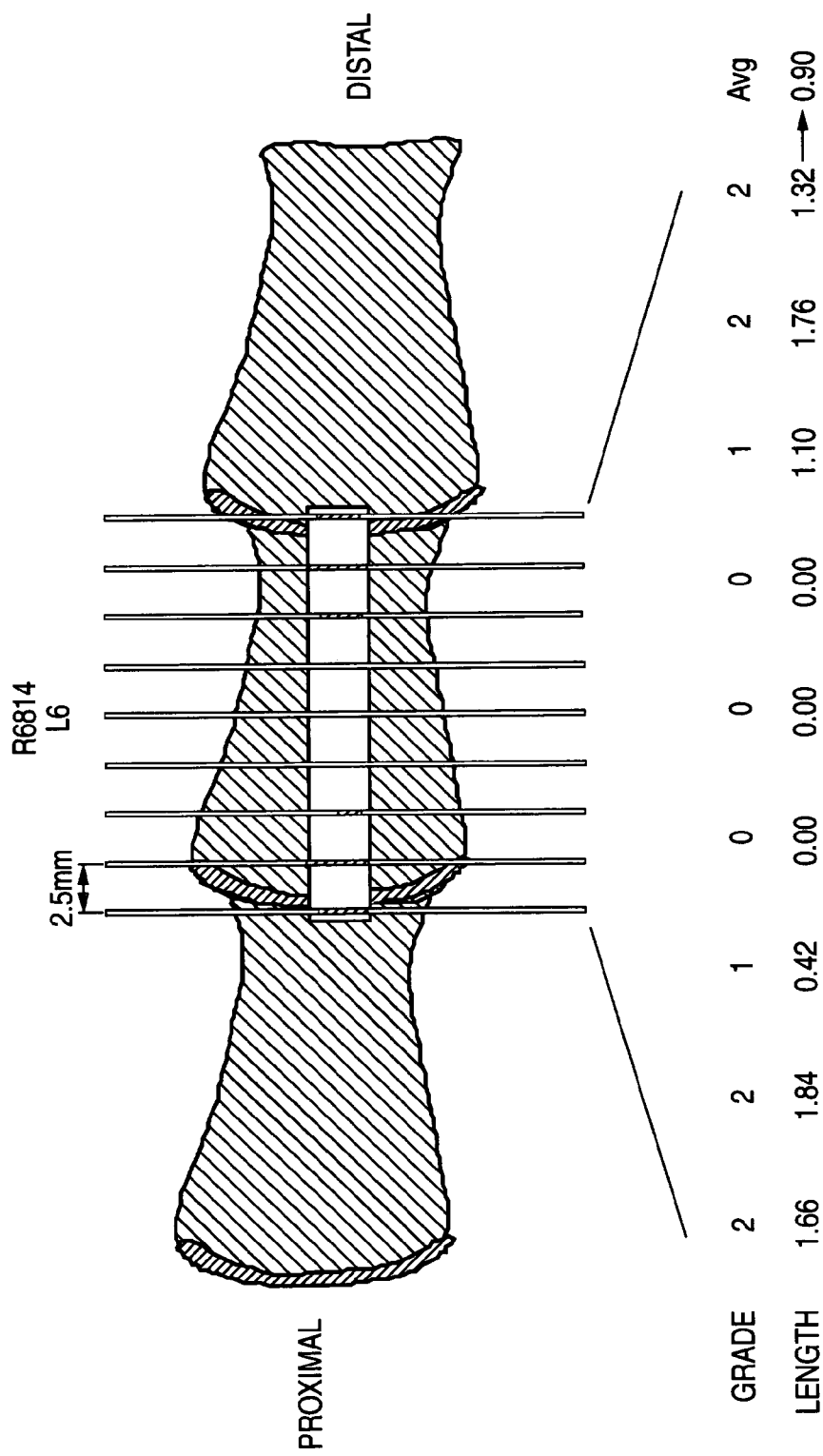
FIG. 4 illustrates the region and interval of MRI measurement and results of them.

In such a manner, the site from which the vertebral arch of the sixth lumbar vertebra had been excised was subjected to MRI imaging at intervals of 2.5 mm and the length of the site stained by gadolinium in the cross-section of the boundary surface between the vertebral body and dura was measured. An average of the length of each rabbit was calculated and one example is shown in FIG. 4.

Figure 5:
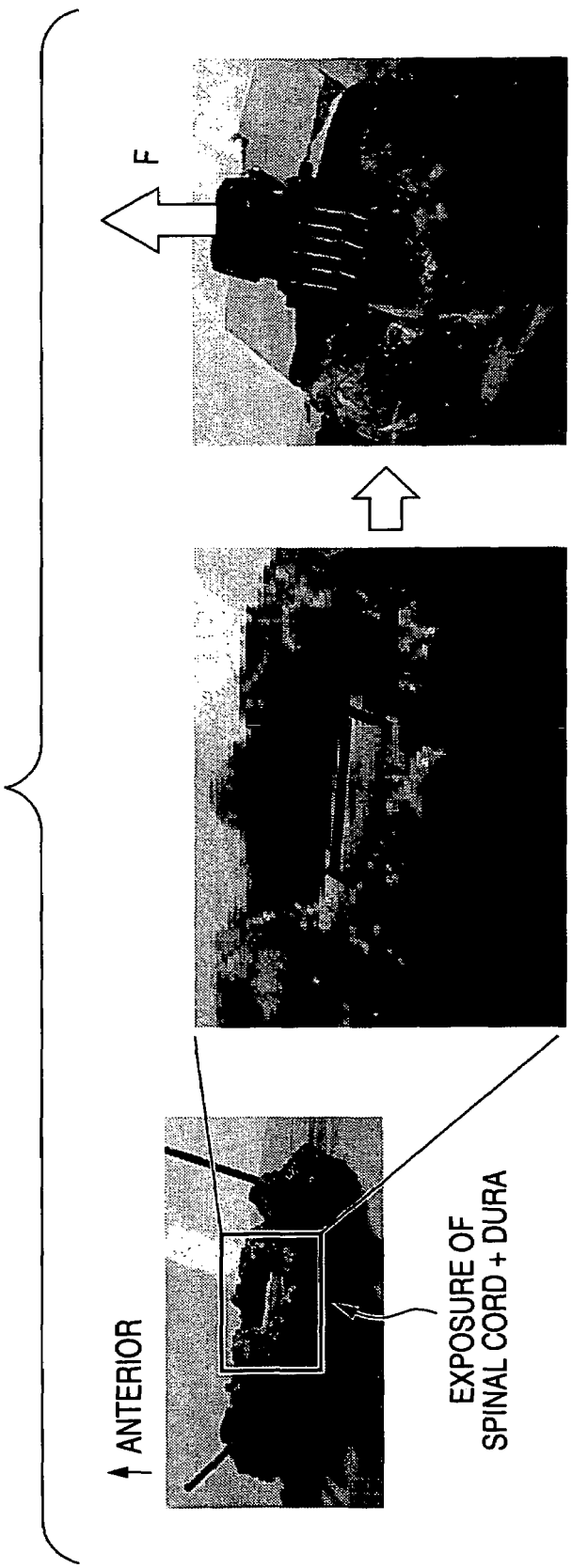
FIG. 5 illustrates the state before separation of the spinal cord with dura.
Figure 6:
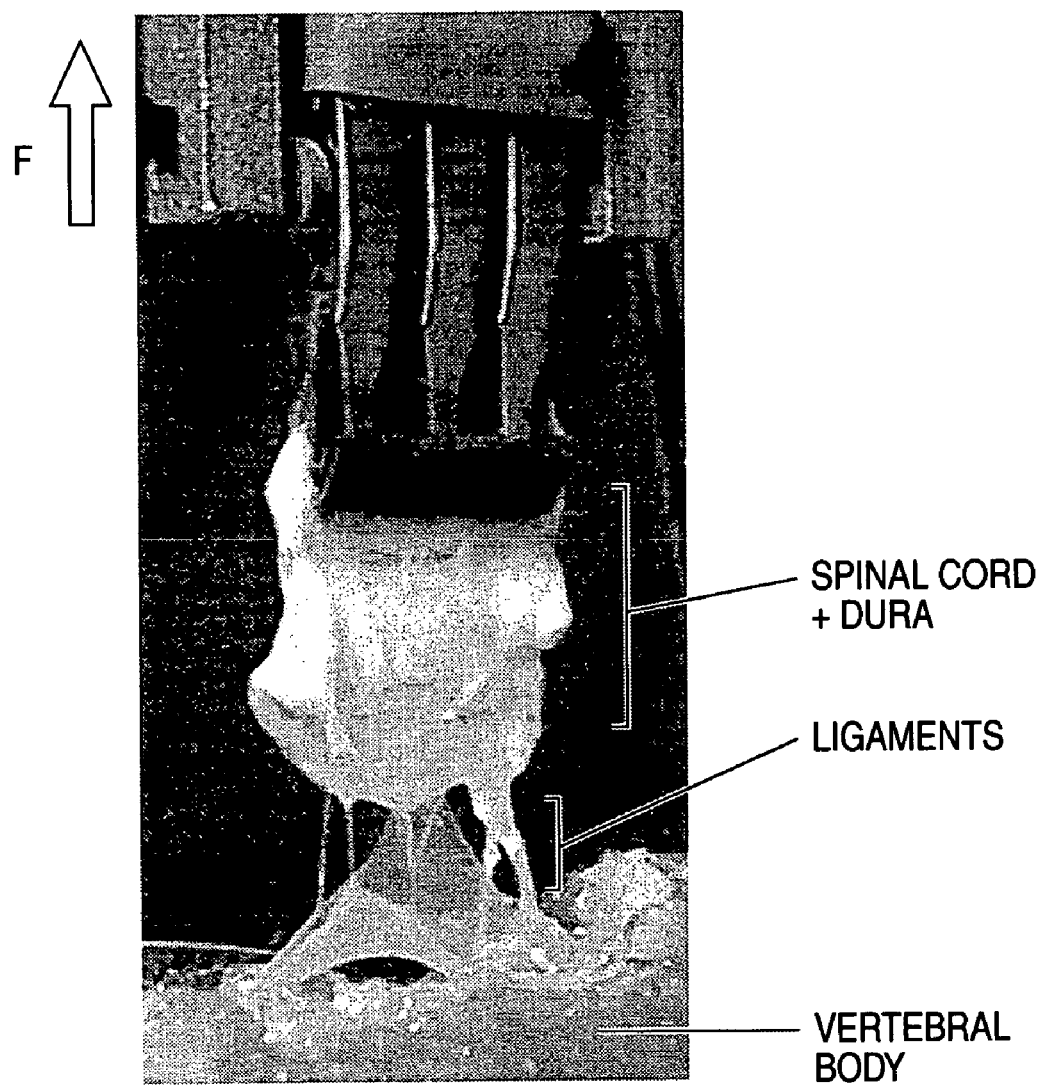
FIG. 6 illustrates actual separation work of the spinal cord with dura.
Figure 7:
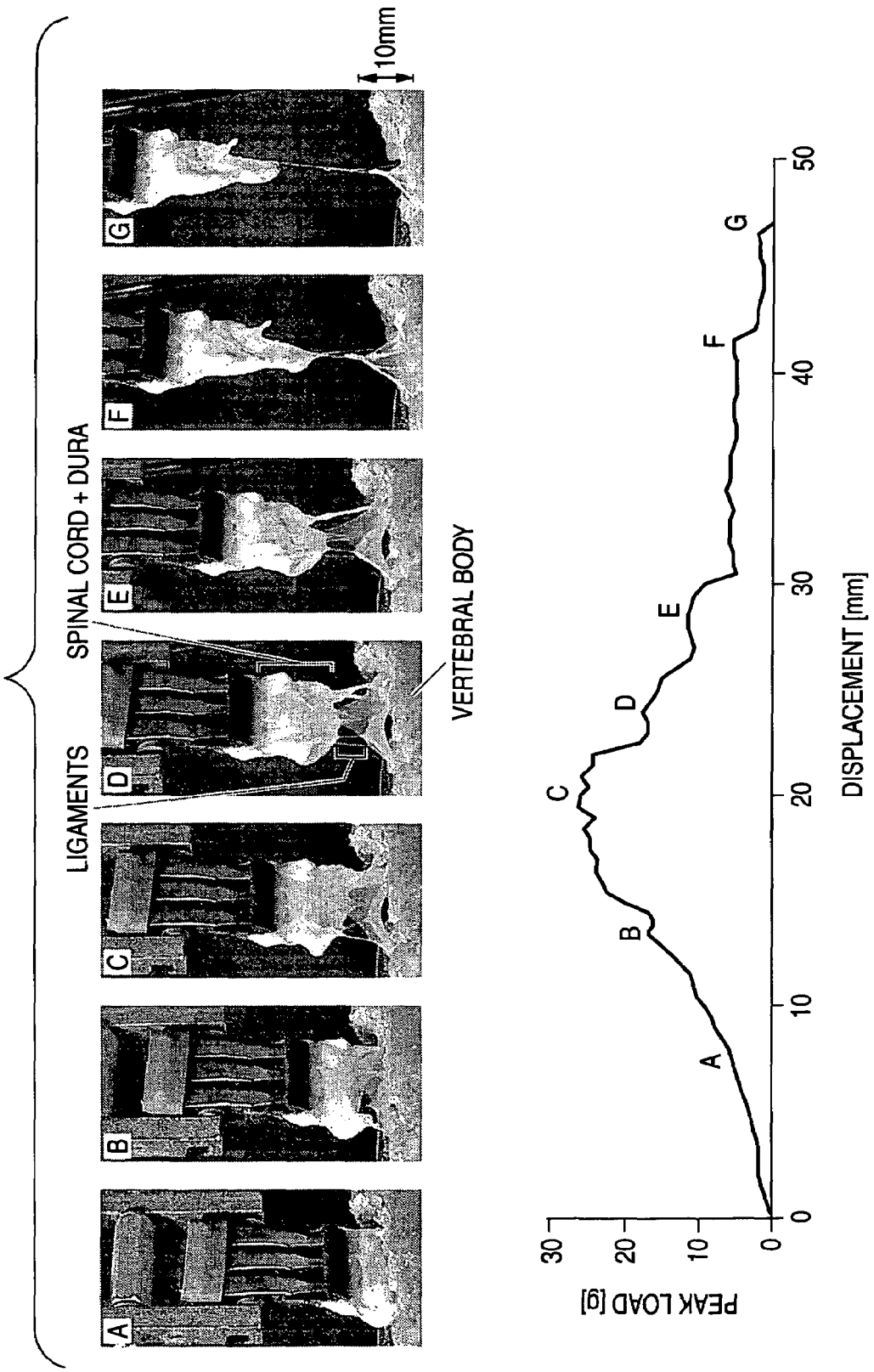
FIG. 7 illustrates the actual separation work of the spinal cord with dura, and a relationship between the displacement and force required therefor.
Figure 8:
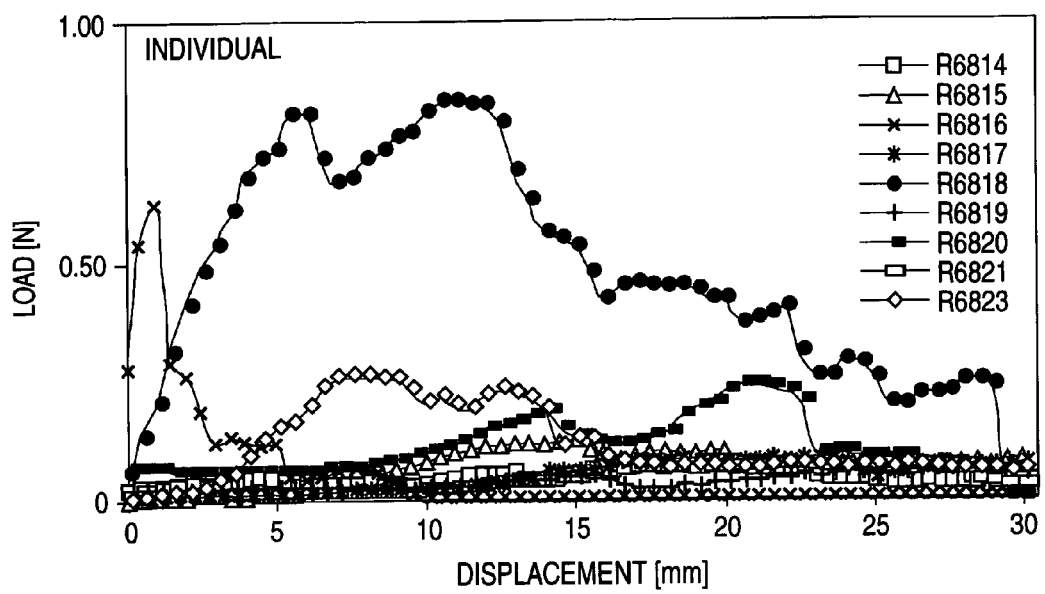
FIG. 8 illustrates the measuring results of the displacement of the spinal cord with dura and force required for the displacement.

Thereafter, the spinal column was taken out and was fenestrated to make an opening of about 17 mm on the side (anterior) opposite to the adhesion formed surface (posterior). At the opening portion, a clamp was set and a force necessary for separating the spinal cord with dura was measured (FIG. 5). FIG. 6 illustrates the actual separation work of the spinal cord with dura. The force necessary for separation directly reflects the adhesion level so that it becomes an index of the adhesion level. FIG. 7 illustrates the actual separation work of the spinal cord with dura and one example of the relationship between the displacement and force required therefor. Actual measuring results are shown in FIG. 8.

Figure 9:
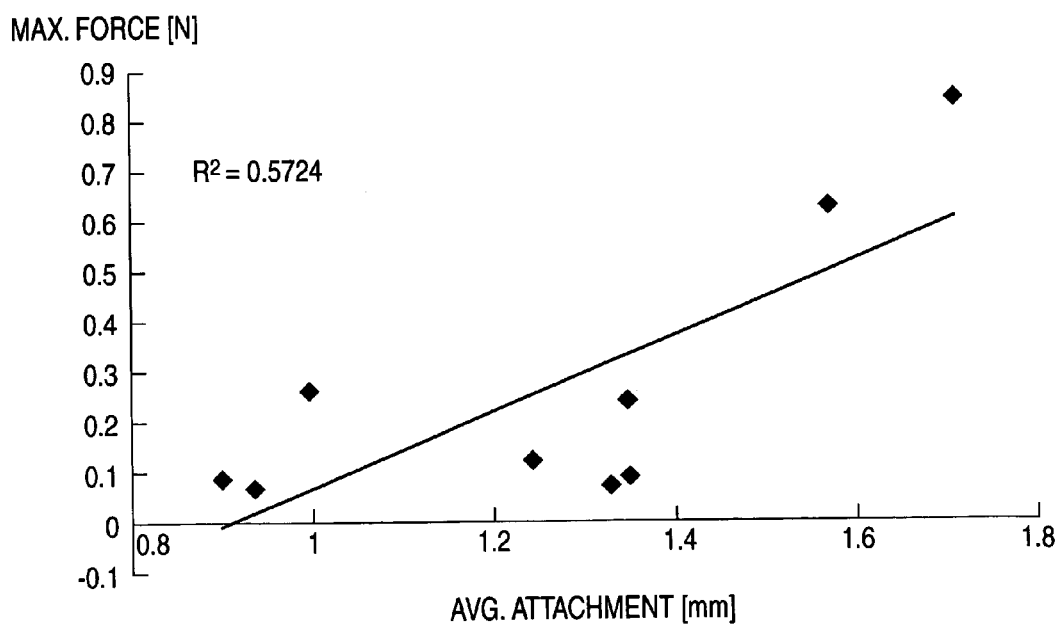
FIG. 9 illustrates the analytical results of the correlation between the maximum force necessary for displacement and "length of a site stained by gadolinium in the cross-section of the boundary surface between the vertebral body and dura" measured by MRI.

The correlation between the maximum force necessary for separation and "length of a site stained by gadolinium in the cross-section of the boundary surface between the vertebral body and dura" as measured by MRI was analyzed. The result is shown in FIG. 9 (n=9, $p<0.10$)($r^2=0.5724$).

Figure 10:
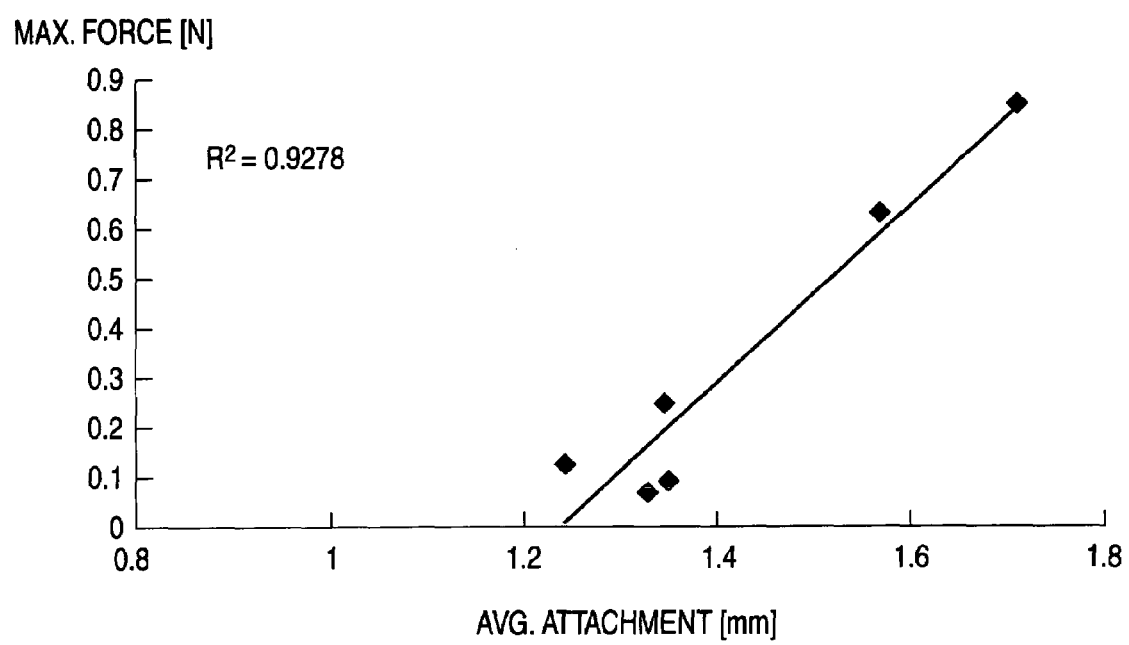
FIG. 10 illustrates the analytical results of the correlation except for the case in which the length of,a site stained by gadolinium in the cross-section of the boundary surface between the vertebral body and dura is 1.2 mm or less.

FIG. 10 shows the analytical results of the correlation in the case where the "length of a site stained by gadolinium in the cross-section of the boundary surface between the vertebral body and dura" not greater than 1.2 mm is regarded adhesion free and therefore excluded (n=6, $p<0.05$) ($r^2=0.9278$).

The "length of a site stained by gadolinium in the cross-section of the boundary surface between the vertebral body and dura" as measured by MRI and actual maximum force (adhesion level) showed a correlation tendency.

In the above-described Example, rabbits were employed. When this method is employed for human beings, it permits more exact evaluation because the site to be analyzed is much greater than that of rabbits.

EXAMPLE 2

NZW rabbits (body weight: 4-5.2 kg, n=20) were used as model animals. While under anesthesia, a posterior midline incision was made from the fifth to the seventh lumbar vertebra. At the sixth lumbar vertebra, the spinus process was removed and then, the ligamentum flavum and the peripheral tissue were removed. In 14 rabbits, the dura in the incised region was removed and the dura of the remaining 6 rabbits was kept intact. After irrigation and hemostasis, the wound was closed.

After 30 days, gadolinium was administered intravenously to the rabbit from an ear vein and the rabbit was imaged with MRI in the supine position while under sedation. A 4.0 tesla functional MRI device was used. MRI imaging of the incised region was performed before and after gadolinium administration and analyzed.

After the MRI imaging, the rabbit was sacrificed and the histological specimen of the incised region was prepared as follows. The lumbar vertebra to the fourth and the sacrum were removed and the specimen of the region from the fifth to the seventh lumbar vertebra was prepared.

The specimen was dehydrated in successively ascending alcohol concentration and fixed using methyl methacrylate. Then sectioning of the specimen in the incised region was performed. Then the prepared histological section was glued to a translucent glass slide. The slide was milled down to approximately 50 µm on a Reichert-Jung Ultrafrase and later stained with Masson-Goldner Trichrome to prepare the histological cross-sectional specimen.

Figure 11:
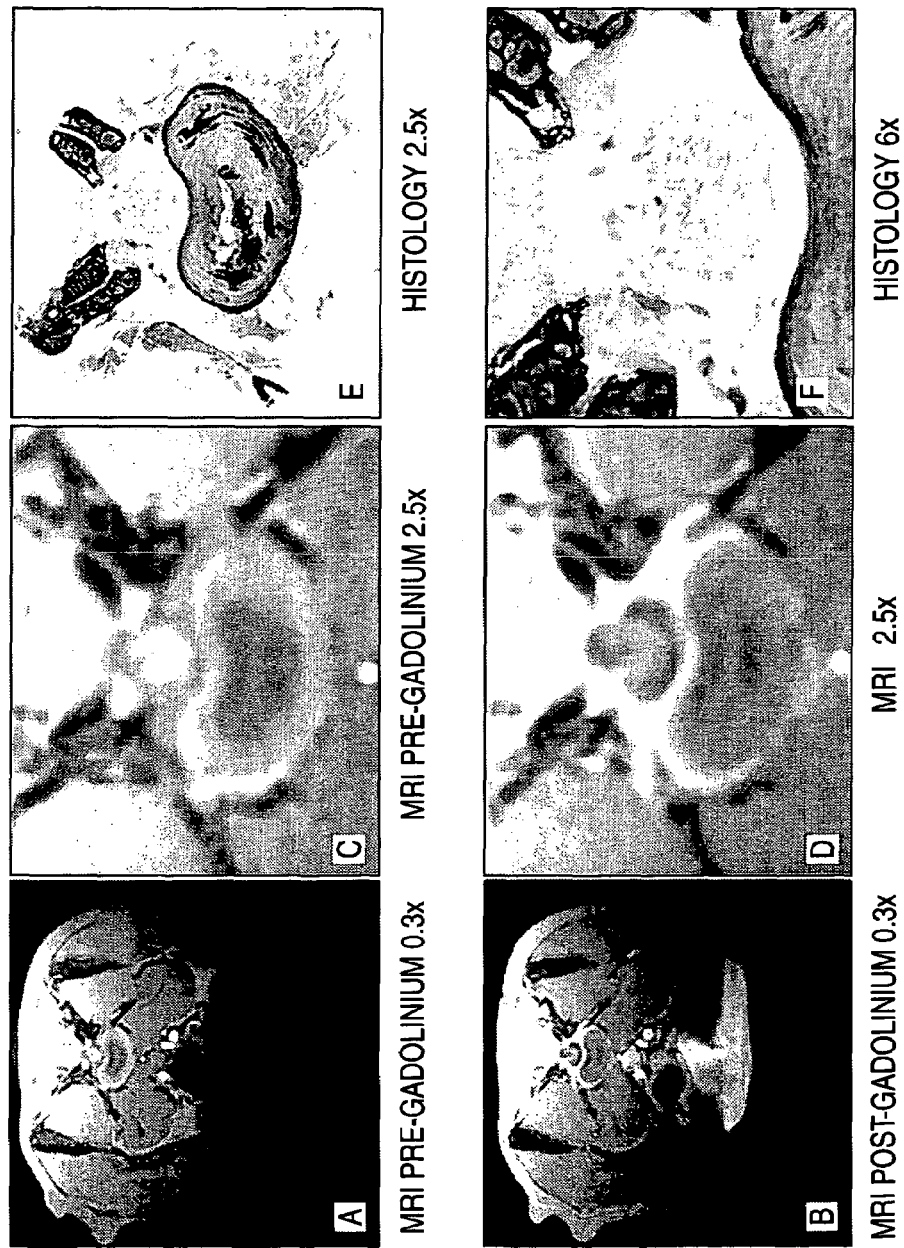
FIG. 11 illustrates correlation of MRI images to histology consisted of matching the corresponding MRI slice (A, B, C, D) with the anatomical features of the histological slice (E). Comparing the pre- and post-gadolinium images, an assessment can be made of the length of attachment in MRI. A similar measurement is made for the length of attachment in the histological slide image (F).

As a typical example, MRI image before administering gadolinium (pre-gadolinium), MRI image after administering gadolinium (post-gadolinium) and histological slide image are shown in FIG. 11 as A and C, B and D and E and F, respectively.

Figure 12:
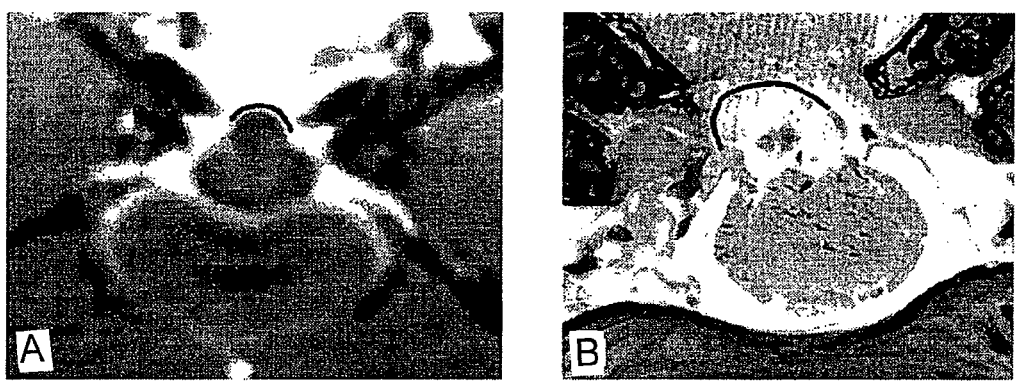
FIG. 12(A, B) illustrates measurement of attachment between scar and dura or spinal cord was based on both post-gadolinium image and histological slide image and measuring the length of interface between the two.

Each cross-section was assessed for the presence of scar and length of scar attachment (adhesion) to the dura or spinal cord. The length of attachment was determined by identifying the edge of the spinal cord or dura in the pre-gadolinium enhanced image and comparing this image to the corresponding post-gadolinium image. A similar measurement of adhesion length was made on each of the histological sections and as a result, it was found that the MRI image and the histological image were matched as shown in FIG. 11 (D, F). In FIG. 12 (A, B), the length of scar attachment (adhesion) to the dura or spinal cord in the post-gadolinium MRI image (A) and the histological slide image (B) was indicated in actual line. The level of the adhesion was extremely high in the rabbits with dural removal.

Figure 13:
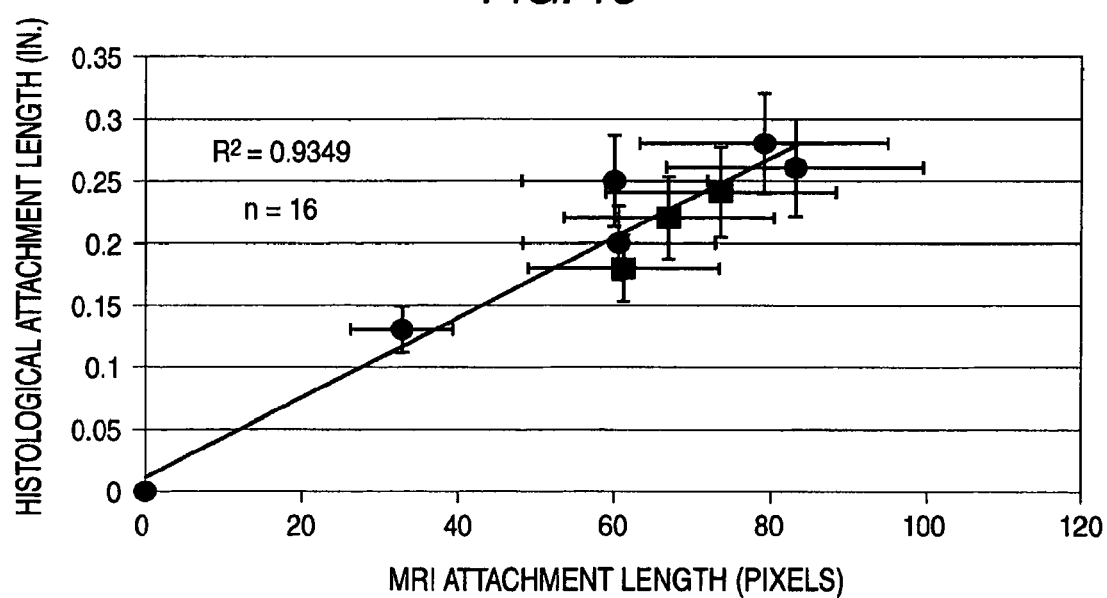
FIG. 13 illustrates regression analysis showing a strong correlation between the lengths of scar attachment on both the MRI and histology images. Specimens had either dura removed (shown by squares) or dura intact (shown by circles). The outlier with zero attachment length appeared to have had spontaneously fused at the histological cross section.

The correlation between the length of adhesion assessed by the MRI image and that assessed by the histological slide image was shown in FIG. 13. Three rabbits with dural removal were paralyzed and one rabbit with dural removal developed an infection and these four rabbits were not used for evaluation. From FIG. 13, a strong correlation was observed between the two results ($R^2=0.9349$).

As a result, it is clear that the level of adhesion was evaluated accurately by performing MRI of the adhesion site after administering gadolinium.

While the present invention has been described in detail and with reference to specific embodiments thereof, it will be apparent to one of skill in the art that various changes and modifications can be made therein without departing from the spirit and scope thereof. All references cited herein are incorporated in their entirety.

This application is based on U.S. provisional patent application No. 60/452,560 filed on Mar. 7, 2003, the entire contents of which are incorporated hereinto by reference.

What is claimed is:

1. A method for evaluation of tissue adhesion level, which comprises evaluating an MRI image on which the cross-section of a boundary surface between a first tissue and a second tissue of an animal administered with gadolinium has been imaged, wherein the length of scar attachment (adhesion) is indicative of the adhesion level between the first tissue and the second tissue.

2. The method according to claim 1, wherein the adhesion level means the strength of adhesion.

3. The method according to claim 2, wherein the strength of adhesion is a force required for separating the first tissue from the second tissue.

4. The method according to claim 1, wherein the first tissue is a vertebral body and the second tissue is a spinal cord with dura.

5. The method according to claim 1, wherein the adhesion means an adhesion occurring after laminectomy.

* * * * *